United States Patent
Bu et al.

(10) Patent No.: US 7,897,513 B2
(45) Date of Patent: Mar. 1, 2011

(54) METHOD FOR FORMING A METAL SILICIDE

(75) Inventors: Haowen Bu, Plano, TX (US); Shashank Ekbote, Allen, TX (US); Juanita Deloach, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/770,593

(22) Filed: Jun. 28, 2007

(65) Prior Publication Data

US 2009/0004853 A1    Jan. 1, 2009

(51) Int. Cl.
H01L 21/44 (2006.01)
(52) U.S. Cl. .................. 438/682; 438/683; 438/655; 438/656; 438/662; 438/664
(58) Field of Classification Search .......... 438/682, 438/683, 655, 656, 664, 662
See application file for complete search history.

(56) References Cited

U.S. PATENT DOCUMENTS

| | | | |
|---|---|---|---|
| 6,165,884 A * | 12/2000 | Lee et al. ................ | 438/592 |
| 2005/0059242 A1* | 3/2005 | Cabral et al. ............ | 438/682 |
| 2005/0070082 A1 | 3/2005 | Kammler et al. | |
| 2005/0176227 A1* | 8/2005 | Wu et al. ................ | 438/592 |
| 2006/0014387 A1* | 1/2006 | Robertson et al. ....... | 438/682 |
| 2006/0240667 A1* | 10/2006 | Matsuda et al. .......... | 438/655 |
| 2007/0072382 A1* | 3/2007 | Yamamoto et al. ....... | 438/305 |
| 2007/0138578 A1 | 6/2007 | Callegari et al. | |
| 2007/0141798 A1 | 6/2007 | Bohr | |
| 2007/0254478 A1* | 11/2007 | Luo et al. ............... | 438/682 |
| 2007/0298575 A1* | 12/2007 | Nouri et al. ............. | 438/308 |
| 2008/0081403 A1* | 4/2008 | Gehring et al. .......... | 438/187 |

FOREIGN PATENT DOCUMENTS

| | | |
|---|---|---|
| JP | 11-233456 | 8/1999 |
| KR | 10-0555541 | 3/2006 |

OTHER PUBLICATIONS

H. Kiyama, "Flash Lamp Annealing Latest Technology for 45nm device and Future devices." In: Advanced Thermal Proceeding of Semiconductors, 2006, RTP '06, 14th IEEE International Conference, ISBN 1-4244-0648-X, pp. 65-71 (Oct. 2006).

S. Ramamurthy, et al. "Nickel Silicide Formation Using Low-Temperature Spike Anneal", p. 37 in Solid State Technology, Oct. 2004 ed.

* cited by examiner

Primary Examiner—Matthew S Smith
Assistant Examiner—John M Parker
(74) Attorney, Agent, or Firm—Warren L. Franz; Wade J. Brady, III; Frederick J. Telecky, Jr.

(57) ABSTRACT

The present application is directed to a method for forming a metal silicide layer. The method comprises providing a substrate comprising silicon and depositing a metal layer on the substrate. The metal layer is annealed within a first temperature range and for a first dwell time of about 10 milliseconds or less to react at least a portion of the metal with the silicon to form a silicide. An unreacted portion of the metal is removed from the substrate. The silicide is annealed within a second temperature range for a second dwell time of about 10 milliseconds or less.

19 Claims, 2 Drawing Sheets

METHOD FOR FORMING A METAL SILICIDE

FIELD OF THE DISCLOSURE

The present application relates generally to the field of semiconductor processing, and more specifically to a method for forming a metal silicide.

BACKGROUND OF THE DISCLOSURE

Metal silicides are well known for use in semiconductor processing. For example, in integrated circuit devices, metal silicides are known to be employed to reduce resistivity of contacts on the source, drain and gate regions of MOS type transistors.

A number of methods for forming silicides have been developed. U.S. Patent Application No. 2006/0014387 teaches one such method in which a silicide is formed in exposed silicon on a semiconductor wafer by a method that includes forming a thin interface layer over the semiconductor wafer. The interface layer can include Ni, Co, Ta, Ti, W, Mo, Pd, Pt or an alloy of these metals. A first low temperature anneal is performed to create the silicide. An unreacted portion of the interface layer is removed, followed by a second low temperature anneal to complete the formation of a low resistance silicide.

A problem that can occur when processing to form metal silicides is that the metals can diffuse along dislocations in the silicon lattice structure and undesirably affect the electrical performance of the circuit. Dislocations can include spike defects and pipe defects. The metal used to form the silicide, such as Ni, can diffuse along and/or gather at the defects. This metal diffusion in relation to the defects can cause, for example, increased leakage current.

Improvements in processing techniques for forming silicides are desired. For example, it would be beneficial in the art to develop new processes for reducing or eliminating the effects of metal defects in silicon devices.

SUMMARY OF THE DISCLOSURE

In accordance with the disclosure. An embodiment of the present application is directed to a method for forming a metal silicide layer. The method comprises providing a substrate comprising silicon and depositing a metal layer on the substrate. The metal layer is annealed within a first temperature range and for a first dwell time of 10 milliseconds or less to react at least a portion of the metal with the silicon to form a silicide. An un reacted portion of metal is removed from the substrate. The silicide is annealed within a second temperature range for a second dwell time of about 10 milliseconds or less.

Another embodiment of the present disclosure is directed to method for forming a nickel silicide layer. The method comprises providing a substrate comprising silicon and depositing a nickel layer on the substrate. The nickel layer is annealed at a temperature ranging from about 280° C. to about 350° C. for a first dwell time of about 10 milliseconds or less to react at least a portion of the nickel layer with silicon to form a silicide. An unreacted portion of the nickel layer is removed from the silicon substrate. The silicide is annealed at a second temperature ranging from about 400° C. to about 550° C. for a second dwell time of about 10 milliseconds or less.

Additional embodiments and advantages of the disclosure will be set forth in part in the description which follows, and can be learned by practice of the disclosure. It is to be understood that both the foregoing general description and the following detailed description are exemplary and explanatory only and are not restrictive of the disclosure, as claimed.

The accompanying drawings, which are incorporated in and constitute a part of this specification, illustrate several embodiments of the disclosure and, together with the description, serve to explain the principles of the disclosure.

DESCRIPTION OF THE EMBODIMENTS

Reference will now be made in detail to various exemplary embodiments of the present application, examples of which are illustrated in the accompanying drawings. Wherever possible, the same or similar reference numbers will be used throughout the drawings to refer to the same or like parts.

Figure 1:
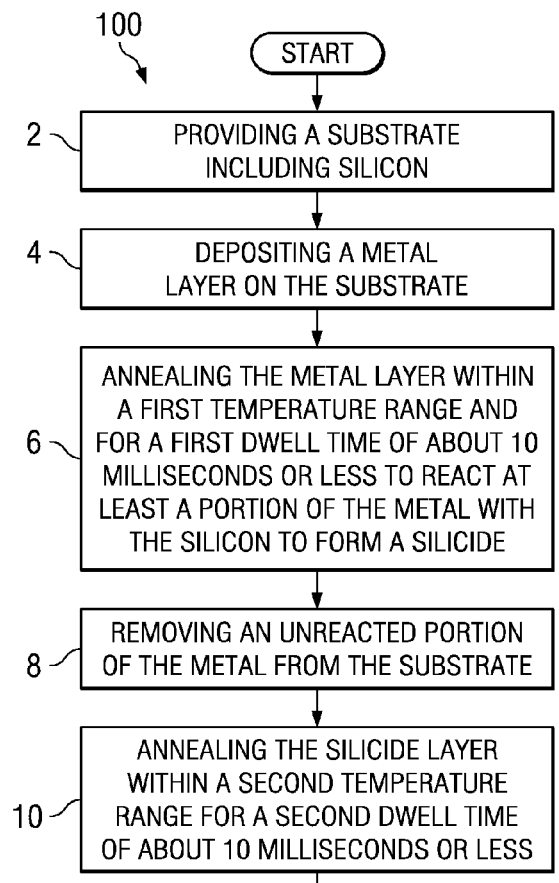
FIG. 1 illustrates a flowchart of a process for forming a metal silicide, according to an embodiment of the present disclosure.

FIG. 1 illustrates a process 100 for forming a metal silicide, according to an embodiment of the present disclosure. Process 100 can begin by providing a substrate including silicon. Any suitable substrate can be provided on which it is desired to form a metal silicide. In one embodiment, the substrate is a wafer for forming a semiconductor device.

Figure 2A:
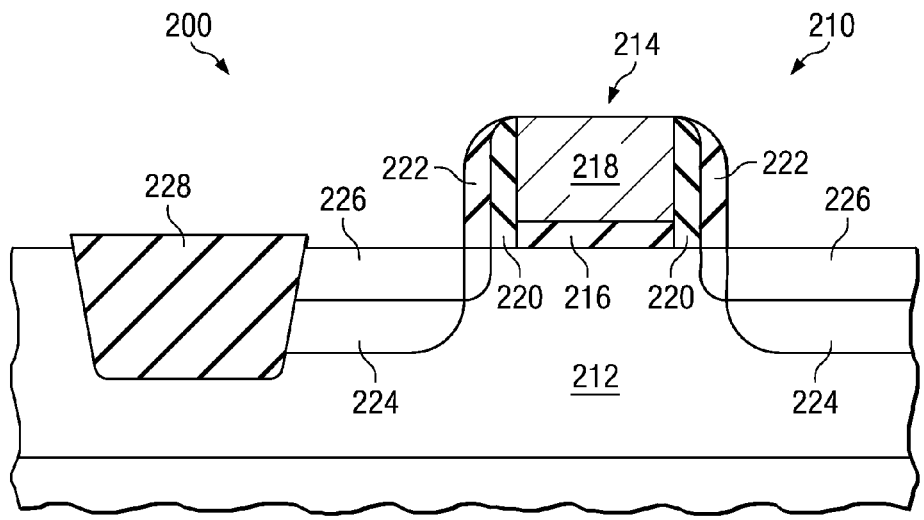
FIGS. 2A to 2C illustrate a process for forming a metal silicide on a substrate, according to an embodiment of the present disclosure.

One example of a suitable substrate 200 is illustrated in FIG. 2A, which includes a cross-sectional view of a partially fabricated integrated circuit device 210. Integrated circuit device 210 can include a well region 212, which can be, for example, an n-well or a p-well, as is well known in the art. A gate stack 214, including a gate dielectric 216, gate electrode 218 and sidewalls 220 and 222, can be formed over well region 212. Source and drain regions 224 and source and drain extensions 226 can be formed in well region 212. Substrate 200 can also include an isolation structure 228. Isolation structure 228 can be any suitable type of isolation structure, include a shallow trench isolation structure ("STI"), LOCOS structure, or any other desired structure.

The formation of well region 212, source/drain regions 224 and source/drain extension regions 226 can include introducing dopants into substrate 200. Introducing such dopants can be performed by any suitable process. In one embodiment, the dopants, such as arsenic, phosphorus or boron, are implanted using an ion implantation process. Such ion implanting processes can introduce defects into substrate 200. The defects can include spike defects and pipe defects, both of which are well known in the art. Annealing processes are generally carried out after each ion implantation processes to, for example, activate the dopant. These annealing processes can help reduce defects. However, due to thermal budget constraints, some defects generally still remain in substrate 200.

Gate electrode 218, which can be made of, for example, polysilicon, can also be doped using an ion implantation process. In addition to introducing dopants for enhancing conductivity of the gate, the ion implantation process can also be used to adjust the stress caused by the gate on a channel region of the device. This stress adjustment occurs because ion implanting with a heavy dopant, such as arsenic, can cause the polysilicon to become amorphous. An annealing process can than be carried out to recrystallize the gate to polysilicon. The recrystallization of the gate can introduce stress onto the channel region of the device that can be beneficial for device function. This ion implantation and recrystallization process can be the same ion implant process that is used to introduce dopants into the source and drain regions. Due to the use of the heavy ions, such as arsenic, the process generally results in defects that are not cured by the subsequent recrystallization and dopant activation anneal. Residual defects exist because the anneal temperature can not be sufficiently high and the anneal time can not be sufficiently long because they are constrained by the shallow junction requirements for deep submicron devices. In an exemplary application, the recrystallization dopant activation anneal temperature is about 1050° C. and the anneal time is about 1-5 seconds.

The defects in substrate 200, including those created during the ion implanting processes discussed above, can result in problems during the silicide forming process. This is because metals, such as nickel (Ni), used to form the silicide can easily diffuse along the crystal defects, resulting in metal diffusion into undesirable areas of the substrate, such as under gate regions. Such metal diffusion and/or metal defects can adversely affect the operation of the device by, for example, causing increased leakage current.

Referring again to FIG. 1, after the substrate is provided a metal layer is deposited on the substrate, as shown at 4. The metal layer can be formed using any suitable method. Examples of such methods that are known in the art include physical vapor deposition (PVD) techniques, such as sputtering, and chemical vapor deposition (CVD) techniques.

Prior to forming the metal layer, the surface of the substrate can be cleaned to remove native oxide and other contaminants that might exist on the source/drain regions and gate regions. The cleaning process (not shown) can include, for example, a wet dip or insitu plasma treatment process. Such processes are well known in the art.

Figure 2B:
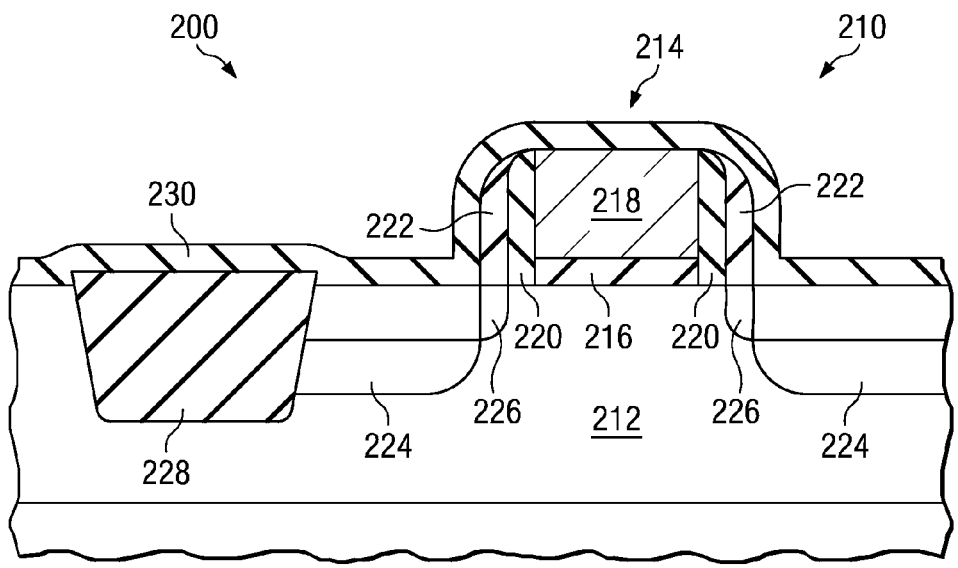

FIG. 2B shows an embodiment of a metal layer 230 after it has been deposited on substrate 200. Metal layer 230 can be any suitable metal, such as, for example, Ni, Co, Ta, Ti, W, Mo, Pd, Pt or an alloy of these metals. In one embodiment, metal layer 230 includes Ni, such as a Ni layer or Ni alloy layer. The thickness of layer 230 can be any suitable thickness, such as, for example, a thickness of about 25 nm or less. In one embodiment, the thickness ranges from about 5 nm to about 10 nm.

Referring again to FIG. 1, an optional silicidation capping layer (not shown) can be deposited after depositing the metal layer at 4. Any suitable capping layer can be employed. One example of a suitable, well known capping layer is a TiN or Ti layer formed to a thickness of 5-30 nm, as described in U.S. Patent Application Publication No. 2006/0014387, the disclosure of which is hereby incorporated by reference in its entirety.

Following the deposition of the metal layer at 4 and the optional silicidation capping layer, a first anneal process is carried out, as indicated at 6 of FIG. 1. The anneal process can include annealing the metal layer within a desired temperature range for a first dwell time of about 10 milliseconds or less, such as from about 1 millisecond to about 6 milliseconds. The desired temperature range can be any suitable range of temperatures. Examples of suitable temperatures can range from about 280° C. to about 700° C. The specific temperatures employed may vary depending on the metal employed for depositing the metal layer at 4. In an embodiment, the metal layer is Ni and the first temperature can range from about 280° C. to about 350° C. In another exemplary embodiment, the metal layer is Co and the first temperature can range from about 600° C. to about 700° C.

Referring to FIG. 2B, the purpose of the first anneal is to react metal layer 230 with the silicon of substrate 200 to form a silicide. The silicide after the first anneal can include various silicide phases, such as $M_xSi_y$, where x can range from about 1 to about 2 and y can range from about 1 to about 2. In embodiments, the metal silicide after the first anneal includes at least some phase other that $M_1Si_1$, such as $M_1Si_2$ or $M_2Si_1$.

The anneal process is performed using a heating apparatus that is capable of achieving very short anneal times, such as on the order of milliseconds. Most heating apparatus currently employed in the art, including rapid thermal anneal type apparatus, are not capable of reproducibly heating at such short anneal times. Examples of apparatus that are capable of heating at such short anneal times include flash lamps and laser anneal apparatus. One example of a suitable flash lamp apparatus that is known in the art is a Flash Annealer manufactured by Dainippon Screen Manufacturing Company (DNS). An example of a suitable laser anneal apparatus that is capable of heating at very short anneal times is LSA100 manufactured by Ultratech Incorporated.

Flash lamps and laser anneal apparatus are capable of ramping up the surface of the wafer to relatively high temperatures in a very short amount of time. For example, ramp up rates can range from about 50,000 degrees C./second to about 200,000 degrees C./second, such as about 100,000 degrees C./second; and ramp down rates can range from about 50,000 degrees C./second to about 200,000 degrees C./second, such as about 100,000 degrees C./second. This can allow a total heat time, defined herein to include both ramping up of the temperature and dwell time within the desired anneal temperature range (but not ramp down times outside of the desired temperature range) of about 20 milliseconds or less, such as about 5 milliseconds to about 10 milliseconds.

As shown at 8 of FIG. 1, the next step in the process is to remove any portions of the metal layer that do not react with the silicon to form silicide. The optional silicidation capping layer can also be removed. The process can include any etch that is selective to the metal, and which will allow the metal silicide to remain after the etch process. Either dry or wet etching processes can be employed. One example of a suitable etch process is a wet etch using a mixture of sulfuric acid, hydrogen peroxide and water. However, any other suitable process may be employed.

As illustrated at 10 of FIG. 1, a second anneal process is performed after the unreacted portion of the metal layer is removed. The anneal process can include annealing the metal silicide regions formed at 6 of process 100 within a desired temperature range for a second dwell time of about 10 milliseconds or less, such as from about 1 millisecond to about 5 milliseconds.

Figure 2C:
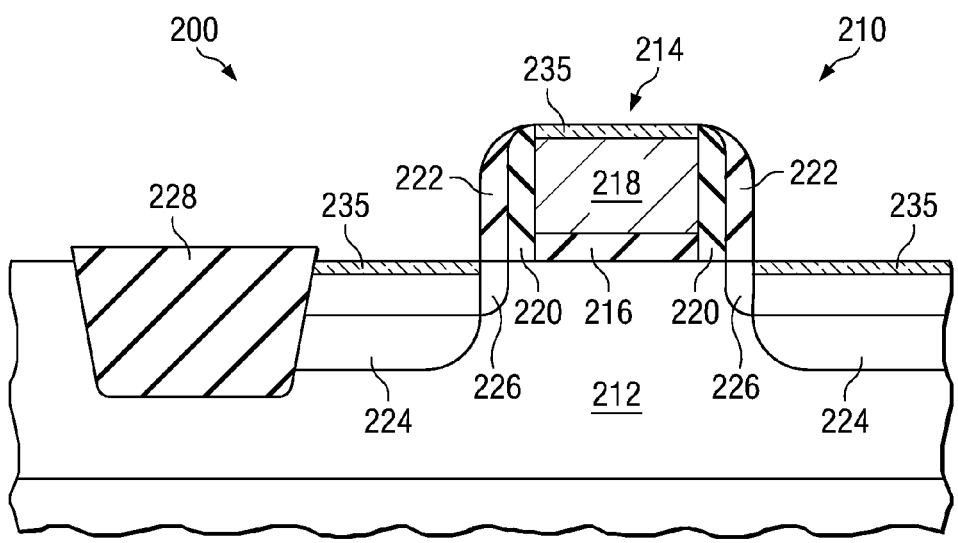

FIG. 2C illustrates an embodiment including substrate 210 with silicide regions 235 formed on the source, drain and gate regions of the substrate, after the metal layer 230 has been removed. The purpose of the second anneal is to convert the silicide regions 236 into a low resistivity silicide. As discussed above, the silicide after the first anneal can include various silicide phases. These silicide phases generally will include at least some phases other than a monosilicide phase of $M_1Si_1$, such as, for example, $M_1Si_2$ or $M_2Si_1$, where M is any of the metals or metal alloys listed above for metal layer 230. However, the monosilicide phase is preferred for providing the desired low resistivity. Thus, the second anneal is employed so that at least some of these undesirable silicide phases of layer 235 are converted to the monosilicide phase.

The second anneal is performed at a second, higher range of temperatures than the first anneal. The desired temperature range can be any suitable range of temperatures. Examples of suitable temperatures can range from about 400° C. to about 900° C. The specific temperatures employed may vary depending on the metal employed for metal layer 230. In an embodiment, metal layer 230 is Ni and the second temperature can range from about 400° C. to about 560° C. In another exemplary embodiment, the first metal layer 230 is Co and the second temperature can range from about 600° C. to about 900° C.

The second anneal process is performed using a heating apparatus that is capable of achieving very short anneal times, such as on either the flash lamp or laser anneal apparatuses discussed above. Ramp up rates can range from about 50,000 degrees C./second to about 200,000 degrees C./second, such as about 100,000 degrees C./second; and ramp down rates can range from about 50,000 degrees C./second to about 200,000 degrees C./second, such as about 100,000 degrees C./second. This can allow a total heat time, which includes both ramping up of the temperature and dwell time at the desired anneal temperature range of about 20 milliseconds or less, such as about 5 milliseconds to about 10 milliseconds.

In an embodiment, the first and second anneals discussed above can be performed in a substantially inert gas environment. Any suitable inert gas can be employed, such as nitrogen gas or argon. In other embodiments, the first and second anneals discussed above can be performed in gas environment that is not inert, such as in the presence of oxygen or air.

After the formation of the metal silicide is complete, fabrication of the device can continue as would be expected by one of ordinary skill in the art, including formation of the remaining front end and back-end structures. Once the fabrication process is complete, the integrated circuit can be tested and packaged.

The processes of the present application can be used in any device that employs a silicide. Such devices can include integrated circuit devices, such as CMOS, biCMOS and bipolar transistors. Various additional modifications to the invention would be within the ordinary skill in the art. For example, cleaning processes may be performed after any step in the fabrication process.

For the purposes of this specification and appended claims, unless otherwise indicated, all numbers expressing quantifies, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. Thus, for example, reference to "an acid" includes two or more different acids. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. A method for forming a nickel silicide layer, the method comprising:
    providing a substrate comprising silicon;
    depositing a nickel layer on the substrate;
    annealing the nickel layer in a first anneal within a first temperature range of about 280° C. to about 350° C. for a first dwell time of about 10 milliseconds or less, to react at least a portion of the nickel layer with the silicon to form a nickel silicide layer;
    removing an unreacted portion of the nickel layer from the silicon substrate; and
    after removing the unreacted portion, annealing the nickel silicide layer in a second anneal within a second temperature range of about 400° C. to about 550° C. for a second dwell time of about 10 milliseconds or less;
    wherein the first anneal comprises ramping up to the first temperature range, dwelling within the first temperature range for the first dwell time, and ramping down from the first temperature range, wherein the ramp up occurs at a rate of about 50,000 to about 200,000° C./second and the ramp down occurs at a rate of about 50,000 to about 200,000° C./second.

2. The method of claim 1, wherein the first anneal comprises radiating the substrate with a flash lamp.

3. The method of claim 1, wherein the first anneal comprises radiating the substrate with a laser.

4. The method of claim 1, wherein the first and second anneals are performed in a substantially inert gas environment.

5. The method of claim 1, wherein the first dwell time is about 1 millisecond to about 5 milliseconds.

6. The method of claim 1, wherein the total ramp up time and dwell time for the first anneal is about 20 milliseconds or less.

7. The method of claim 1, wherein the second dwell time is about 1 millisecond to about 5 milliseconds.

8. The method of claim 1, wherein the second anneal comprises ramping up to the second temperature range, dwelling within the second temperature range for the second dwell time, and ramping down from the second temperature range, wherein the ramp up occurs at a rate of about 50,000 to about 200,000° C./second and the ramp down occurs at a rate of about 50,000 to about 200,000° C./second.

9. The method of claim 8, wherein the total ramp up time and dwell time for each of the first and second anneals is about 20 milliseconds or less.

10. The method of claim 9, wherein the dwell time for each of the first and second anneals is about 1 millisecond to about 5 milliseconds.

11. The method of claim 10, wherein each of the first and second anneals comprises radiating the substrate with a laser.

12. The method of claim 10, wherein each of the first and second anneals comprises radiating the substrate with a flash lamp.

13. A method for forming a nickel silicide layer, the method comprising:
    providing a substrate comprising silicon;
    depositing a nickel layer on the substrate;
    annealing the nickel layer in a first anneal within a first temperature range of about 280° C. to about 350° C. for a first dwell time of about 10 milliseconds or less, to react at least a portion of the nickel layer with the silicon to form a nickel silicide layer;

removing an unreacted portion of the nickel layer from the silicon substrate; and after removing the unreacted portion, annealing the nickel silicide layer in a second anneal within a second temperature range of about 400° C. to about 550° C. for a second dwell time of about 10 milliseconds or less;

wherein the second anneal comprises ramping up to the second temperature range, dwelling within the second temperature range for the second dwell time, and ramping down from the second temperature range, wherein the ramp up occurs at a rate of about 50,000 to about 200,000° C./second and the ramp down occurs at a rate of about 50,000 to about 200,000° C./second.

14. The method of claim 13, wherein the second anneal comprises radiating the substrate with a flash lamp.

15. The method of claim 13, wherein the second anneal comprises radiating the substrate with a laser.

16. The method of claim 13, wherein the total ramp up time and dwell time for the second anneal is about 20 milliseconds or less.

17. The method of claim 13, wherein the first and second anneals are performed in a substantially non-inert gas environment.

18. A method for forming a nickel silicide layer, the method comprising:

providing a substrate comprising silicon;

depositing a nickel layer on the substrate;

using a laser or flash lamp, annealing the nickel layer within a first temperature range of about 280° C. to about 350° C. for a first dwell time of about 10 milliseconds or less, to react at least a portion of the nickel layer with the silicon to form a nickel silicide layer;

removing an unreacted portion of the nickel layer from the silicon substrate; and using a laser or flash lamp after removing the unreacted portion, annealing the nickel silicide layer within a second temperature range of about 400° C. to about 550° C. for a second dwell time of about 10 milliseconds or less;

wherein each of the first and second anneals comprises ramp up and ramp down rates of about 50,000° C./second or more, and total ramp up and dwell times of 20 milliseconds or less.

19. The method of claim 18, wherein the dwell times are 5 milliseconds or less.

* * * * *